United States Patent
Bhagwan

Patent Number: 5,942,947
Date of Patent: Aug. 24, 1999

[54] CURRENT-REGULATED, VOLTAGE-CONTROLLED OSCILLATOR WITH DUTY CYCLE CORRECTION

[75] Inventor: Raghunand Bhagwan, Sunnyvale, Calif.

[73] Assignee: Sun Microsystems, Inc., Palo Alto, Calif.

[21] Appl. No.: 08/795,533

[22] Filed: Feb. 5, 1997

[51] Int. Cl.$^6$ .................................................... H03L 7/085
[52] U.S. Cl. .................................. 331/8; 331/10; 331/14; 331/17; 331/25
[58] Field of Search ................................... 331/8, 10, 14, 331/17, 25

[56] References Cited

U.S. PATENT DOCUMENTS 5,463,353  10/1995  Countryman et al. ..................... 331/57

OTHER PUBLICATIONS von Kaenel, V., et al., "A 320MHz, 1.5mW at 1.35V CMO"S PLL for Microprocessor Clock Generation," 1996 IEEE Intl. Solid–State Circuits Conf., "Digital Clocks and Latches," Session 8, Paper FA 8.2, pp. 132–133.

*Primary Examiner*—Siegfried H. Grimm
*Attorney, Agent, or Firm*—Townsend and Townsend and Crew LLP

[57] ABSTRACT

A voltage controlled current source provides controlled current to a current controlled oscillator in a high frequency phase-locked loop clock generator. The voltage controlled current source receives a first control signal and a set of second control signals indicative of a phase difference between the output signal of the clock signal generator and a reference frequency. It uses those control signals to adjust the current-controlled oscillator. A level shifter coupled to the current-controlled oscillator amplifies the oscillator signals to full rail and adjusts the duty cycle at its output to 50% to produce the clock signal generator output signal.

14 Claims, 4 Drawing Sheets

CURRENT-REGULATED, VOLTAGE-CONTROLLED OSCILLATOR WITH DUTY CYCLE CORRECTION

BACKGROUND OF THE INVENTION

This invention relates to voltage-controlled oscillators, and in particular to a current-regulated voltage-controlled oscillator, for example, for application to phase-locked loop circuits.

Numerous phase-locked loop circuits and voltage-controlled oscillator circuits are well known in the art. Such circuits are widely used as clock generators in microprocessors or other digital devices. One well known approach is described in "A 320 MHz, 1.5 mW at 1.35 V CMOS PLL for Microprocessor Clock Generation," by von Kaenel, V., et al., 1996 International Solid-State Circuits Conference, "Digital Clocks and Latches," Session 8, Paper FA 8.2, pp. 132–133. The phase-locked loop circuit described in this paper is intended to operate continuously at low power. Because it is on the same chip as the microprocessor, the power supply switching noise for the digital circuits is controlled to minimize jitter. The voltage-controlled oscillator shown in that paper is a typical circuit for such devices. Unfortunately, phase-locked loop devices using voltage-controlled oscillators, such as depicted, use a resistor to implement loop stabilization and to control the damped nature of the transient response. Secondly, the voltage-controlled oscillator is usually operated at twice the ultimately desired clock speed. This effects the power supply noise rejection. Furthermore, such devices suffer from a dependence upon the process technology used to fabricate the device. The process technology will change the resistance of a resistor (see LF in FIG. 1 of the above paper) in the circuit. As the resistance varies, the stability of the loop and the transient response damping may both be compromised.

For these reasons, as well as others, an improved circuit is desired.

SUMMARY OF THE INVENTION

This invention provides a clock generator using a phase-locked loop circuit which operates at very low voltages, yet is capable of operating up to a gigaHertz frequency. The circuit relies upon a phase-locked loop approach in which a phase detector provides output signals indicative of a phase difference between a current-controlled oscillator and a frequency. The output signals are used to control a circuit which provides increasing or decreasing current to the current-controlled oscillator to adjust its oscillations to match the reference frequency.

The invention achieves high power supply noise rejection without loss of head room by converting the controlling voltage into a regulated current with the use of a regulated cascode current source. This current drives a current-controlled oscillator which produces a signal whose frequency is proportional to the current. The duty cycle for the current-controlled oscillator is not 50%, and neither does its voltage swing to the rails. The duty cycle is corrected with a level shifter.

Use of the regulated cascode current source allows the oscillator to run up to its fastest possible speed. When running in its normal range, it provides good power supply noise rejection in the sense that the output current varies minimally with the variations in power supply. With minimally varying current, the fluctuations in the frequency are also minimal.

The level shifter is designed to amplify the current controlled oscillator signals to full rail, and adjust the duty cycle of its output to 50% over the frequency range of the oscillator. A tap is taken from the regulated cascode current source and applied to the falling edge circuit of the level shifter, so as to position the falling edge precisely between the rising edges. As frequency varies, the voltage on the tap varies and adjusts the falling delay in proportion.

In a preferred embodiment, a phase-locked loop circuit according to the invention includes a first input node coupled to receive a first input signal having a reference frequency, a second input node coupled to receive a second input signal having a second frequency to be compared with the first input signal, and a detector circuit which is connected to receive the input signals and in response supply a first control signal and a set of second control signals.

The control signals from the detector circuit are supplied to a voltage-controlled oscillator which in response controls current flowing through a selected transistor. A current-controlled oscillator is coupled to the selected transistor and responsive to the current flowing therethrough to provide a clock signal which is synchronized with a reference frequency.

The invention also includes a unique circuit for the voltage-controlled oscillator which converts the control signals from the detector into current pulses driving the current-controlled oscillator, and thereby implement the loop zero to achieve a damped response and stability of the loop.

DESCRIPTION OF THE SPECIFIC EMBODIMENTS

The ever-increasing speed of microprocessors and other digital logic devices, and the simultaneous reduction of power supply voltages for such devices, are imposing more restrictions on the design of clock generators. Clock generators must now provide a low jitter output, even in the presence of increasingly hostile power supply environments and larger frequency multiplication factors. This invention provides a PLL clock generator which operates at extremely low voltages, yet in one embodiment is capable of providing up to a gigaHertz frequency signal at 1.6 volts.

In microprocessors, a common practice is to use a 50% duty cycle clock. Often this is implemented by operating the voltage-controlled oscillator at twice the reference frequency and then dividing the output signal by two. As the number of gate delays in the microprocessor critical path decreases, this method, however, becomes less optimal. One reason is that the voltage-controlled oscillator begins to work closer to its maximum speed, and therefore has reduced head room for power supply noise rejection. This invention employs a duty cycle correction scheme where it is possible to correct the duty cycle of the voltage-controlled oscillator output without resorting to division by two, thereby improving the power supply noise rejection of the voltage-controlled oscillator (herein sometimes "VCO").

Figure 1:
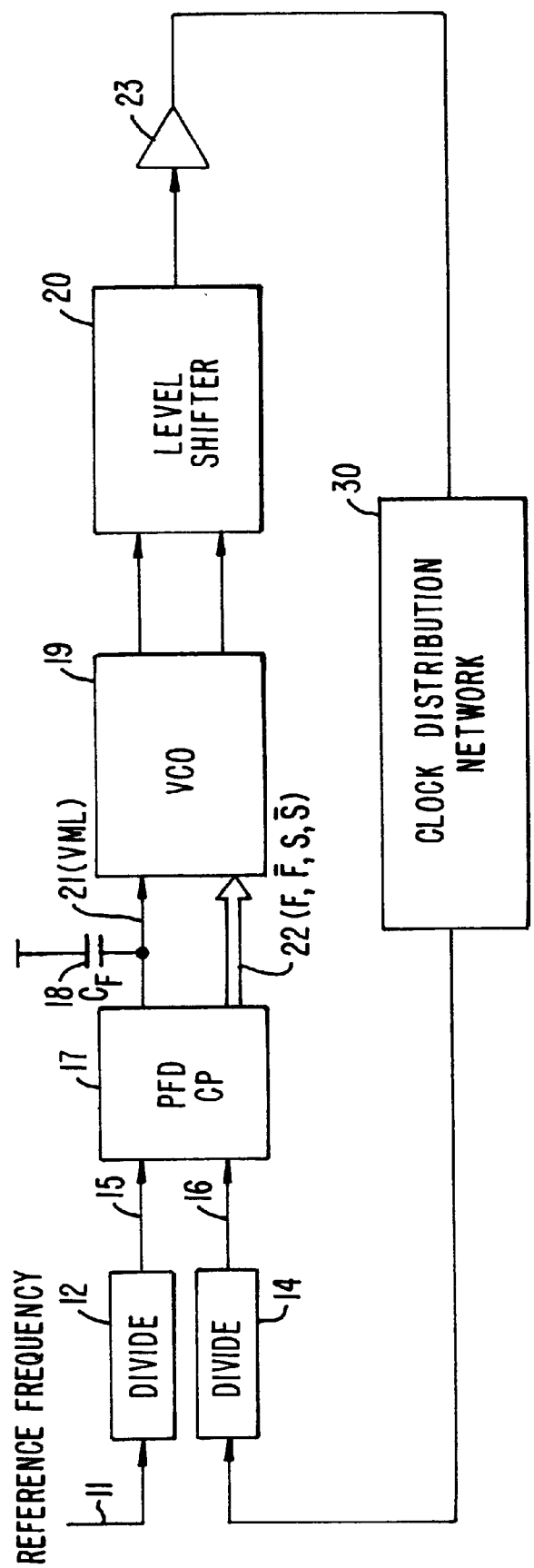
FIG. 1 is a block diagram of a phase-locked loop circuit.

FIG. 1 illustrates the overall phase-locked circuit according to a preferred embodiment of the invention. As shown, an external reference frequency is supplied on line 11 to a programmable divider 12. At the same time an output signal from a clock distribution network 30 is supplied to divider 14. Each of dividers 12 and 14 is of well known design, and it is not necessary for the dividers to divide by the same amount. For example, divider 12 may divide the reference input signal by four, while divider 14 divides the signal from the clock distribution network by two.

The output signals from the dividers are supplied over lines 15 and 16 to a phase frequency detector and charge pump 17. The phase frequency detector detects whether the signals it receives on lines 15 and 16 are synchronized. In response, the detector 17 provides output signals on line 21 and lines 22 which indicate the relationship of the input signals. For example, lines 22 will have pulses on them, depending upon whether the input signals being received by detector 17 on line 15 arrive earlier than those on line 16 or vice versa. Line 21 drives loop filter capacitor $C_F$ 18 and carries signal $V_{ML}$ which is supplied to oscillator 19. Signal $V_{ML}$ on line 21, which as will be explained below, controls the conductivity of transistor M1 (FIG. 2), while the second set of output signals on lines 22 provide information about the time relationship between the reference frequency and the output from the clock distribution network 30, and implement damping and stability digitally.

The voltage-controlled oscillator supplies an output signal whose frequency is proportional to its input voltage. The VCO 19 operates at frequencies up to about 1 gigahertz and at low power supply voltages. It possesses very high power supply noise rejection for minimal jitter. The output signals from the voltage-controlled oscillator 19 are supplied to a level shifter 20 and a buffer 23 before being supplied to the clock distribution network 30. The clock distribution network provides signals to other circuitry (not shown). Of course, the output frequency of the oscillator 19 will depend upon the control signals supplied to it over lines 21 and 22. The result of the circuit shown in FIG. 1 will be to lock the oscillations provided to the clock distribution network to be a multiple or submultiple of the reference frequency.

Figure 2:
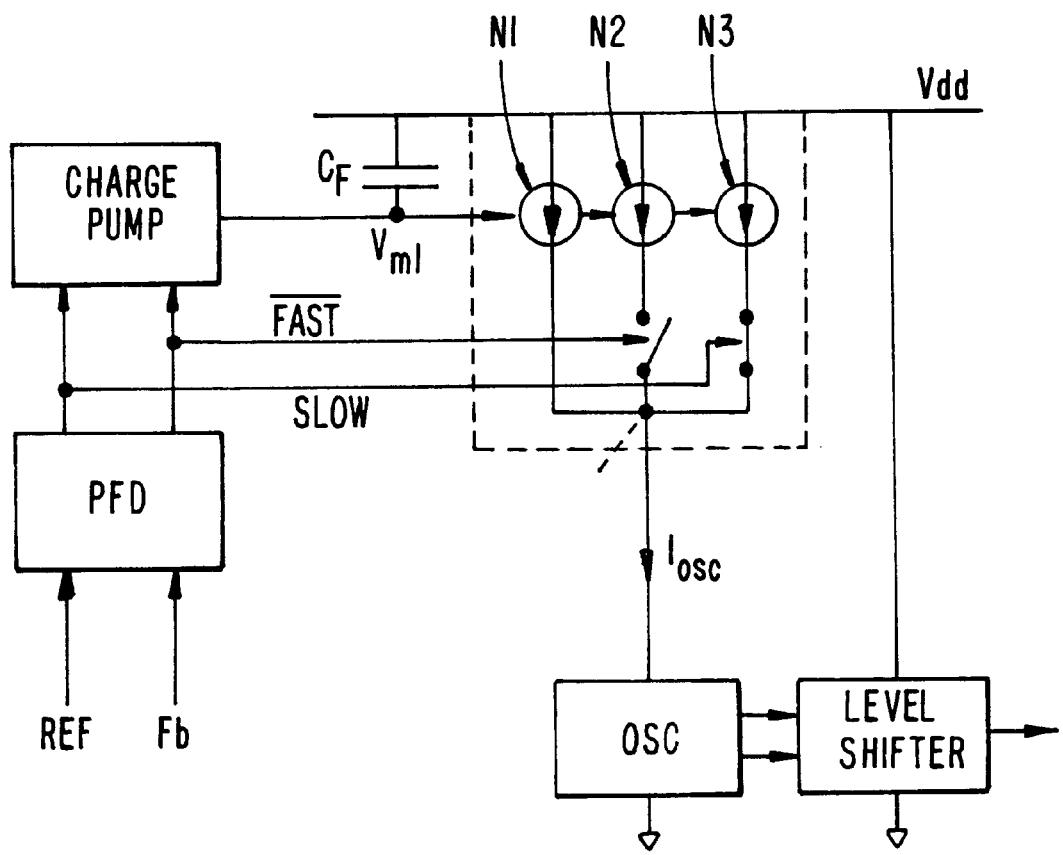
FIG. 2 is a block diagram of a preferred embodiment.

FIG. 2 is a block diagram of a preferred embodiment of the invention. As shown a reference frequency Ref and a frequency to be compared Fb are supplied to a phase frequency detector ("PFD") and charge pump. The detector supplies signals Slow (S) and inverted Fast (F) pulses to control switches connecting transistors M2 and M3 to the oscillator OSC. The condition of the switches, and the potential $V_{ML}$, control the amount of current which flows to the oscillator OSC. The current controls the frequency of oscillation, as will be described further in conjunction with the next Figure.

Figure 3:
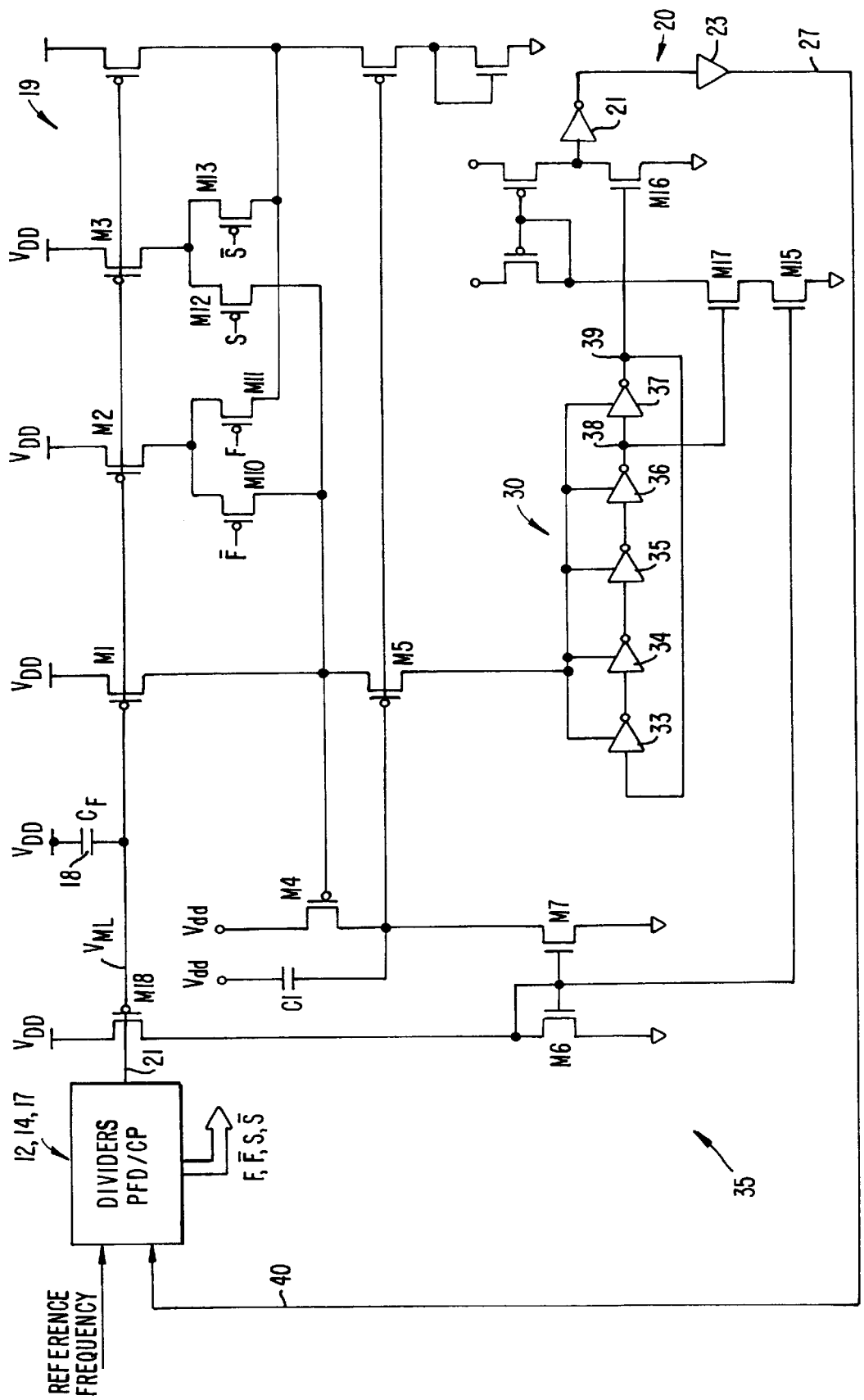
FIG. 3 is a detailed circuit schematic of the circuit shown in FIG. 2.

FIG. 3 is a detailed circuit schematic of the circuitry shown generally in FIG. 2. Portions of the circuit corresponding to those in FIG. 1 have been designated with corresponding reference numerals to those of FIG. 1.

As described with respect to FIG. 1, and also partially with respect to FIG. 2, the circuit shown in FIG. 3 includes programmable dividers, a phase frequency detector, and a charge pump shown generally in the upper left corner. Because each of these employs well-known circuitry and techniques, they are shown as a single block in the upper left-hand corner of FIG. 3. The output from this circuit is the $V_{ML}$ signal on line 21 which is supplied to the remainder of the circuitry shown in the FIG. 3, as well as pulses F, $\overline{F}$, S, and $\overline{S}$ on various lines. The $V_{ML}$ signal, together with the other signals, controls the current flowing to the current-controlled oscillator 30 through transistor M5.

Generally, FIG. 3 includes a voltage-controlled oscillator 19 including, a voltage-to-current converter 35 shown in the lower left portion of the circuitry, a current-controlled oscillator 30 shown in the lower central portion of the figure, and a level shifter 20 shown in the lower right-hand portion of the figure. Each of these major constituents is described below in additional detail.

In the circuit of FIG. 3 a filter capacitor CF is tied to $V_{DD}$ to provide better power supply noise rejection. In addition, if $V_{DD}$ changes, then $V_{ML}$ changes, providing a constant gate-to-source voltage across transistor M5. The drain-to-source voltage will also be constant because of regulating cascode action of M4, M5, M6 and M7. The combination of transistors M4 and M5 provides a cascode circuit, as described below.

The circuit depicted includes a five-stage current-controlled inverter ring 30 formed by inverters 33, 34, 35, 36, and 37. The drive current for the inverters is provided by regulated cascode transistor M5. As the $V_{ML}$ signal drops, transistor M1 is caused to conduct more, which provides a greater drive current through transistor M5 to the oscillator 30. As the current increases, the speed of oscillation of ring 30 increases, thereby increasing the output frequency. Decreases in the current from transistor M1 will decrease the frequency of oscillation. The stabilizing capacitor C1 helps compensate for the regulated cascode.

To achieve stability, and control the damping of the PLL transient response, a digital damping approach is used in the circuit of FIG. 3. The digital damping replaces the conventional resistor in the filter of prior art circuits, by providing a zero to the loop transfer function. Generally the technique functions by dividing the drive current for the current controlled oscillator into three parts. There is a steady source of current through a first transistor M1 and there are two sources M2 and M3 which are controlled by a first current steering path M10 and M11, and a second current steering path M12 and M13. These paths allow current to be steered in and out of the current controlled oscillator, and the paths are controlled by the output signals from the phase frequency detector.

In addition to the output signal $V_{ML}$, the phase frequency detector provides output signals indicative of the leading or trailing relationship between the two clock signals it receives. If the reference frequency signal precedes the VCO signal, then "fast" (F) pulses (and complementary "fast" ($\overline{F}$) pulses) will be generated for the duration between the two rising edges. As will be described, these will have the impact of speeding up the oscillator 30 and the VCO signal, thereby reducing the time difference between the two rising edges. On the other hand, if the VCO signal on line 40 lags the return frequency signal, then slow pulses (S),(as well as complementary "slow" ($\overline{S}$) pulses) will be generated for the duration of the phase error. These actions will have the impact of slowing the current-controlled oscillator 30 until the reference frequency and the VCO are locked. The fast and slow pulses from the phase frequency detector, together with their complementary signals, are applied to transistors M10, M11, M12, and M13 as depicted. These F, $\overline{F}$, S and $\overline{S}$ signals, by turning these transistors on and off, add or subtract drive current to the signal from transistor M5, thereby coarsely controlling the current-controlled oscillator 30.

Transistors M2 and M3 are also and connected to be controlled by $V_{ML}$. Each of the transistors is sized to set the open loop phase gain. The desired phase gain is set by the ratio of the sizes of M1, M2, and M3. Preferably, the transistors are sized so that the ratio of the channel width of transistor M2 to M1 is about 0.1, and the ratio of the channel widths of transistor M3 to M1 is approximately the same value.

If the feedback signal 40 lags the reference signal, indicating an error in phase or frequency between oscillator and reference frequency, there will be a net positive pulse in the oscillator current, giving a short positive kick to the oscillator frequency, which causes a phase shift to the oscillator output, thereby at least partially correcting the error. If the feedback signal lags the reference signal the opposite will occur, causing a negative phase shift to the oscillator. Thus, any phase difference at the PFD input terminals is directly translated as phase correction to the oscillator output, implementing the loop zero function.

Figure 4:
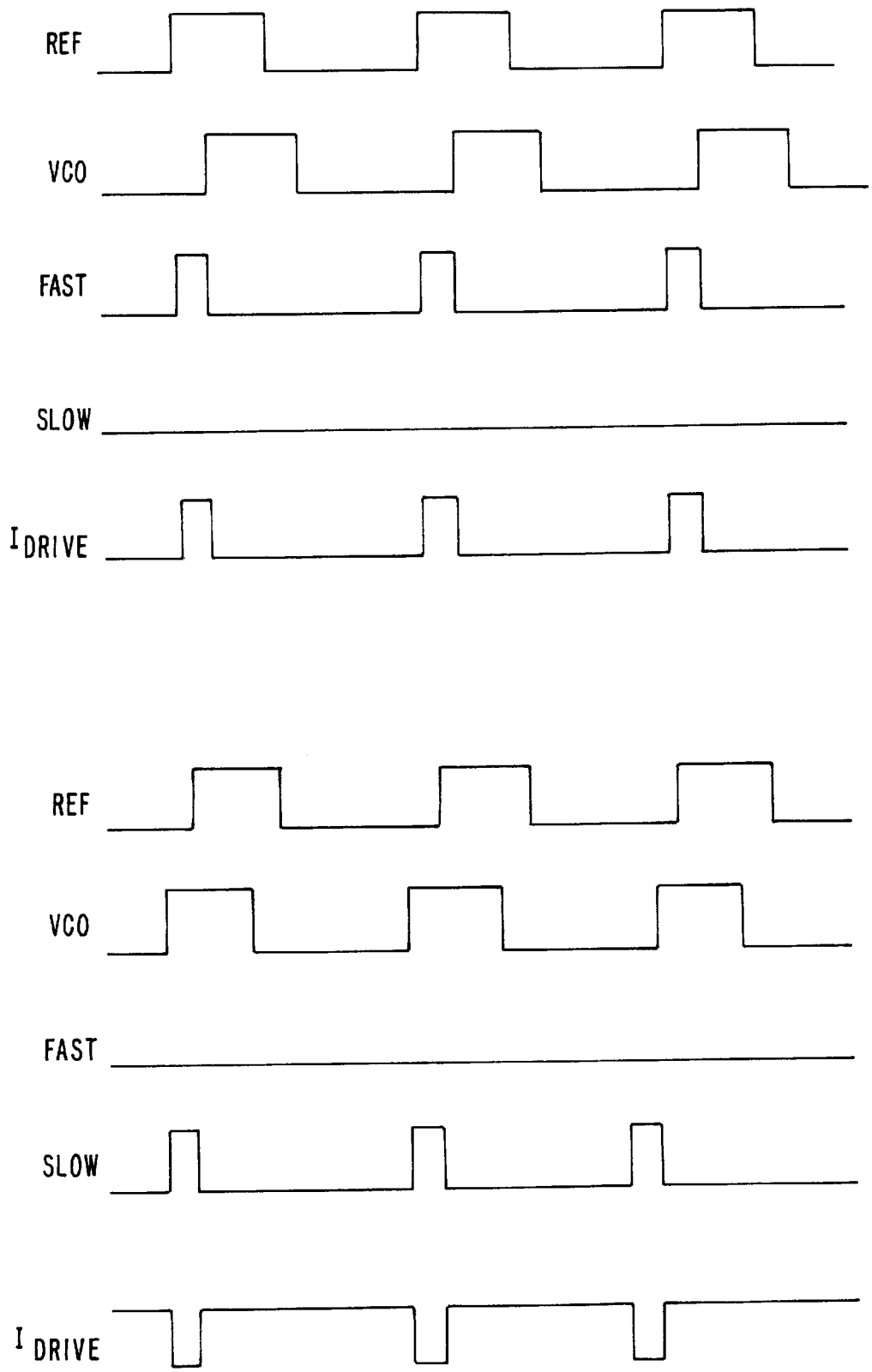
FIG. 4 is a timing diagram of some of the signals of FIG. 3.

FIG. 4 is a timing diagram illustrating the timing relationship of various signals in the circuit shown in FIG. 3. The upper portion of FIG. 4 shows the situation in which the signal VCO on line 40 lags the reference frequency. The reference clock signal is shown together with the VCO. For the circumstance depicted, a fast pulse F is generated during the period between the rising edge of the reference clock signal and the VCO signal. The slow clock signal is not generated at all, as is also illustrated. The absence of the slow signal, and the intermittent presence of the fast signal, create increased drive current for the oscillator 30, thereby speeding up its oscillations.

The lower portion of FIG. 4 illustrates a circumstance in which the signal on line 40 leads the reference frequency. Because the VCO signal leads the reference signal, a slow clock pulse is generated, and no fast clock pulse is generated. This results in a reduction in the amount of drive current, thereby slowing the oscillations of oscillator 30.

Typical prior art oscillators were operated at twice the desired frequency, which was then divided by two. Conventional microprocessors, however, operate at such high clock speeds that it is not feasible to operate the current-controlled oscillator at twice the microprocessor clock rate. In addition, operating at such high frequencies consumes too much power. Therefore duty cycle correction is built into the level shifter; the operation of which is described below.

In the circuit shown in FIG. 3, in its fastest mode the VCO 19 operates at the same frequency as the desired microprocessor (or other component) frequency. Duty cycle correction is incorporated in the level shifter 20 by a delay element M15 designed to place the falling edge precisely between successive rising edges.

The current-controlled oscillator 30 receives drive current from transistor M1 and is coupled to level shifter 20. The two output nodes from the ring oscillator 30 control level shifter transistors M16 and M17. When node 38 goes high, the level shifter output goes low, and when input 39 goes high, the level shifter output also goes high. The precise placement of the falling edge between rising edges is achieved by controlling the current in transistor M15. Transistor M15 in level shifter 20 functions as a current source which operates under control of the current mirror 35 formed by transistors M6 and M18.

Current source M15 is controlled by the current mirror converter which includes transistors M6 and M7. The DC voltage from the common node between their gates controls the current source. M15 should be sized appropriately to give a 50% duty cycle at the midpoint of the VCO operating range. As the frequency drops, the potential at that common node will drop which will starve the current source more and stretch out the falling edge to maintain a 50% cycle and vice versa.

The foregoing has been a description of the preferred embodiment. It will be appreciated that numerous departures from the specific circuitry shown may be made without departing from the spirit of the invention, which is further defined in the appended claims.

What is claimed is:

1. A phase lock loop circuit comprising:
    a first input node coupled to receive a first input signal having a reference frequency;
    a second input node coupled to receive a second input signal having a second frequency to be compared with the first input signal;
    a detector circuit coupled to receive the first and the second input signals, and in response supply a first control signal and a set of second control signals;
    a voltage-controlled current source coupled to receive the first control signal and the set of second control signals and in response control current flowing through a selected transistor, wherein the second control signals are connected to control at least two transistors connected to control current flowing through the selected transistor; and
    a current-controlled oscillator coupled to the selected transistor and responsive to the current flowing therethrough to provide a clock signal synchronized with the reference frequency.

2. A circuit as in claim 1 wherein the first control signal is also coupled to control conductivity of the selected transistor.

3. A circuit as in claim 2 wherein the second control signals are coupled to additional transistors to also control current flowing through the selected transistor.

4. A circuit as in claim 1 wherein the current-controlled oscillator comprises a sequence of serially connected inverters.

5. A circuit as in claim 3 wherein the set of second control signals comprises four signals, each of which is coupled to control a separate transistor.

6. A circuit as in claim 5 wherein each of the four signals is coupled to a transistor.

7. A phase lock loop circuit as in claim 1 wherein the voltage-controlled current source comprises:
    first, second, and third transistors having control electrodes connected to receive the first control signal;
    a fourth transistor connected between an upper power supply and a control electrode of the selected transistor, the selected transistor being connected between the first transistor and the current-controlled oscillator to provide current to the oscillator; and
    a circuit connected to receive the set of second control signals, and connected between the second and third transistors and the selected transistor to further control the current-controlled oscillator.

8. A circuit as in claim 7 wherein the circuit connected to receive the set of second control signals comprises a separate transistor for each of the control signals.

9. A circuit as in claim 8 wherein the set of second control signals comprises at least two control signals, one designating that the oscillator signal leads the reference signal and one that the oscillator signal lags the reference signal.

10. A circuit as in claim 9 wherein the set of second control signals comprises four control signals, a first pair designating that the oscillator signal leads the reference signal and a second pair designating that the oscillator signal lags the reference signal.

11. A circuit as in claim 10 wherein the four signals comprise two pairs of complementary signals.

12. A phase lock loop circuit comprising:
    a first input node coupled to receive a first input signal having a reference frequency;

a second input node coupled to receive a second input signal having a second frequency to be compared with the first input signal;

a detector circuit coupled to receive the first and the second input signals, and in response supply a first control signal and a set of second control signals;

a voltage-controlled current source coupled to receive the first control signal and the set of second control signals and in response control current flowing through a selected transistor;

a current-controlled oscillator coupled to the selected transistor and responsive to the current flowing therethrough to provide a clock signal synchronized with the reference frequency; wherein the current-controlled oscillator includes a plurality of stages, and further including a level shifter circuit connected between the current-controlled oscillator and the second input node for maintaining a desired duty cycle at an output terminal of the level shifter circuit;

the level shifter circuit comprising:
 a current source coupled to a first transistor;
 a second transistor serially connected between the current source and a current mirror circuit;
 a third transistor connected between the current mirror circuit and a lower potential; and wherein the second transistor is controlled by a first node in the current-controlled oscillator, and the third transistor is controlled by a second node in the current-controlled oscillator.

13. A voltage-controlled oscillator comprising:

an input node connected to receive a first control signal;

first, second, and third transistors having control electrodes connected to receive the control signal;

a fourth transistor connected between an upper power supply and a control electrode of a fifth transistor, the fifth transistor being connected between the first transistor and a current-controlled oscillator to provide current to the oscillator;

a sixth and a seventh transistor connected to each other and in series with the second transistor, the sixth transistor being connected to control the fourth transistor, and the seventh transistor being connected to a node;

an eighth and a ninth transistor connected to each other and in series with the third transistor, the eighth transistor also being connected to also control the fourth transistor, and the ninth transistor being connected to the node;

whereby the combination of the control signal and signals coupled to the fifth, sixth, seventh, eighth and ninth transistors control current flowing through the fifth transistor to the current-controlled oscillator.

14. A phase lock loop circuit comprising:

a first input node coupled to receive a first input signal having a reference frequency;

a second input node coupled to receive a second input signal having a second frequency to be compared with the first input signal;

a detector circuit coupled to receive the first and the second input signals, and in response supply a first control signal and a set of second control signals, the set of second control signals representing any phase difference between the first input signal and the second input signal;

a voltage-controlled current source coupled to receive the first control signal and the set of second control signals and in response supply current to a current-controlled oscillator to cause synchronization of the second input signal with the first input signal;

a level shifter which has an adjustable falling edge delay at a first node and a fixed rising edge delay at a second node;

one node of the current controlled oscillator having a frequency range of operation and which is connected to the first node of the level shifter and another node of the current controlled oscillator being connected to the second node of the level shifter; and wherein the falling edge delay is controlled proportionately to the frequency of the oscillator to give a desired duty cycle over the frequency range.

* * * * *